US006492246B1

(12) United States Patent
Cho et al.

(10) Patent No.: US 6,492,246 B1
(45) Date of Patent: Dec. 10, 2002

(54) METHOD OF FORMING A TRANSISTOR IN A SEMICONDUCTOR DEVICE

(75) Inventors: Gyu Seog Cho, Kyungki-Do (KR); Kyung Wook Park, Kyungki-Do (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 46 days.

(21) Appl. No.: 09/708,510

(22) Filed: Nov. 9, 2000

(30) Foreign Application Priority Data

Nov. 9, 1999 (KR) .............................. 99-49506

(51) Int. Cl.⁷ ................. H01L 21/00; H01L 21/8238; H01L 21/76
(52) U.S. Cl. .................. 438/430; 438/153; 438/217; 438/429
(58) Field of Search ............... 438/153, 217, 438/429, 430

(56) References Cited

U.S. PATENT DOCUMENTS

| | | | | | |
|---|---|---|---|---|---|
| 5,763,310 | A | * | 6/1998 | Gardner | 438/270 |
| 6,103,574 | A | * | 8/2000 | Iwasaki | 438/257 |
| 6,110,799 | A | * | 8/2000 | Huang | 438/430 |
| 6,156,618 | A | * | 12/2000 | Lee | 438/381 |
| 6,165,854 | A | * | 12/2000 | Wu | 438/296 |
| 6,184,107 | B1 | * | 2/2001 | Divakaruni et al. | 438/427 |
| 6,238,960 | B1 | * | 5/2001 | Maszara et al. | 438/197 |
| 6,251,734 | B1 | * | 6/2001 | Grivna et al. | 438/296 |
| 6,255,193 | B1 | * | 7/2001 | Sperlich et al. | 438/430 |
| 6,274,913 | B1 | * | 8/2001 | Brigham et al. | 257/368 |
| 6,277,707 | B1 | * | 8/2001 | Lee et al. | 438/430 |
| 6,281,082 | B1 | * | 8/2001 | Chen et al. | 438/296 |
| 6,316,331 | B1 | * | 11/2001 | Tseng | 438/431 |
| 6,323,105 | B1 | * | 11/2001 | Chen et al. | 438/430 |

FOREIGN PATENT DOCUMENTS

| | | | |
|---|---|---|---|
| DE | 003732611 A1 | * | 4/1989 |
| EP | 0135307 A2 | * | 3/1985 |
| JP | 0112657 A2 | * | 7/1984 |
| JP | 406338516 A | * | 12/1994 |

* cited by examiner

*Primary Examiner*—Caridad Everhart
*Assistant Examiner*—Chuong Luu
(74) *Attorney, Agent, or Firm*—Finnegan, Henderson, Farabow, Garrett, & Dunner, L.L.P.

(57) ABSTRACT

There is disclosed a method of manufacturing a transistor in a semiconductor device. The present invention isolates a semiconductor substrate by an oxide layer with only a source, a drain and a channel region necessary for driving a transistor being left. Thus, it can obviate the current components due to parasitic factors to improve the punch-through characteristic.

7 Claims, 2 Drawing Sheets

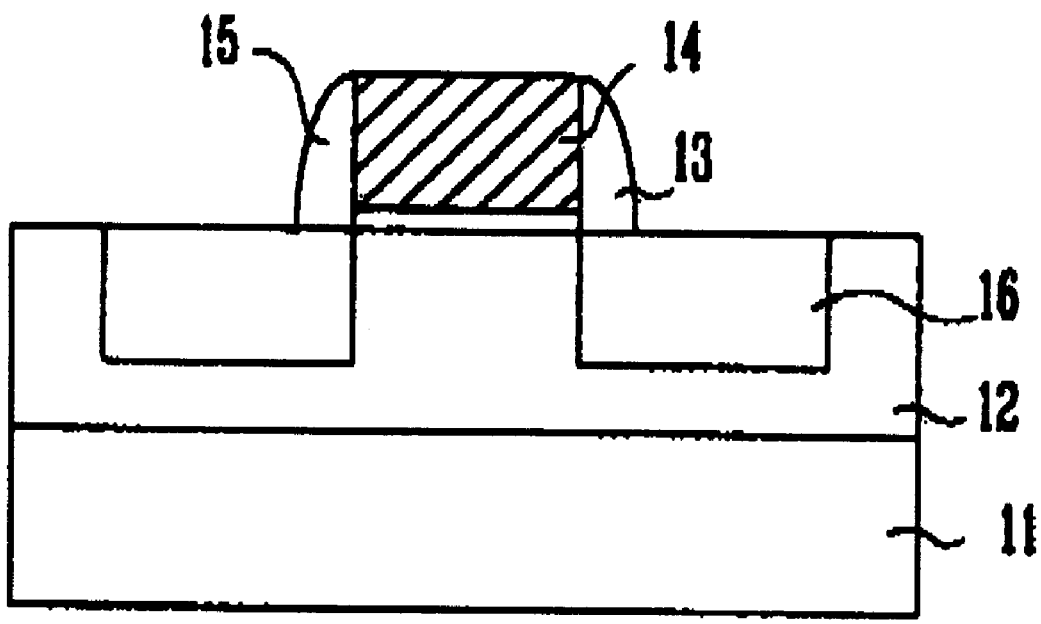

METHOD OF FORMING A TRANSISTOR IN A SEMICONDUCTOR DEVICE

BACKGROUND OF THE INVENTION

1. Field of the Invention

The invention relates generally to a method of manufacturing a transistor in a semiconductor device. More particularly, the present invention relates to a method of manufacturing a transistor in a semiconductor device by which a semiconductor substrate is isolated by an oxide layer with only a source, a drain and a channel region necessary for driving a transistor being left, thus obviating the current components due to parasitic factors to improve the punch-through characteristic.

2. Description of the Prior Art

A method of manufacturing a conventional MOS transistor will be explained by reference to FIG. 1. A device isolation film (not shown) for isolating a cell region and a field region is formed on a semiconductor substrate 11. After a well 12 is formed on the semiconductor substrate 11, an ion implant process for adjusting the threshold voltage is performed. Then, a gate oxide film 13 is formed on the semiconductor substrate 11. Thereafter, a polysilicon layer, a polysilicon layer/a metal silicide layer or a metal layer, etc. is deposited on the gate oxide film 13 and is then patterned to form a gate electrode 14. Next, after a spacer insulating film 15 is formed on the sidewall of the gate electrode 14, a source/drain junction 16 is formed on the semiconductor substrate 11 by source/drain ion implant process.

In the transistor manufactured by the above method, if the voltage is applied to the drain and the gate is turned on, current will flows from the drain to the source. On the other hand, if the gate is turned off, the current from the drain to the source will be blocked. However, if the voltage applied to the drain is too great, unwanted current will flow into the well. This current is called a punch-through current. The punch-through current is generated when carriers are applied to a depletion layer and are then attracted by a bias of the depletion layer. This phenomenon becomes still severe as the length of the gate becomes narrower and will limit to manufacturing higher devices.

SUMMARY OF THE INVENTION

It is therefore an object of the present invention to provide a method of manufacturing a transistor in a semiconductor device capable of improving reliability of the device, by removing a well being the cause of generation of the punch-through so that the punch-through current does not generate.

In order to accomplish the above object, a method of manufacturing a transistor in a semiconductor device according to the present invention is characterized in that it comprises the steps of providing a semiconductor substrate and etching one part of the semiconductor substrate to form a first trench at a position where a transistor will be formed; etching the other part of the semiconductor substrate to form two trenches at a position where a source junction and a drain junction will be formed; implanting oxygen ions into the entire portions of the semiconductor substrate including the first and second trenches and then performing a thermal process to form a buried oxide layer within the semiconductor substrate; isolating, by the buried oxide layer, the semiconductor substrate of the portion where a source/drain junction will be formed, and of the portion where a channel region will be formed, by polishing process; and performing ion implant process for controlling the threshold voltage to form a channel region and then forming a gate oxide film, a gate electrode and a source/drain junction.

BRIEF DESCRIPTION OF THE DRAWINGS

The aforementioned aspects and other features of the present invention will be explained in the following description, taken in conjunction with the accompanying drawings, wherein:

FIG. 1 is a sectional view of a conventional MOS transistor; and

DETAILED DESCRIPTION OF PREFERRED EMBODIMENTS

Figure 2A:
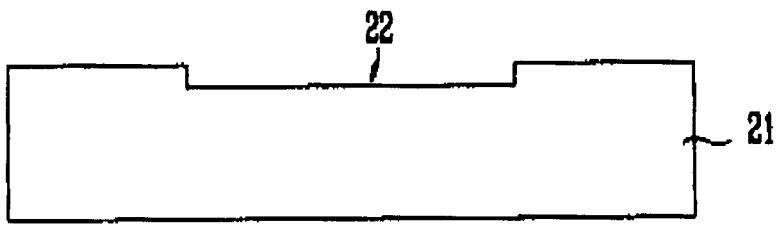
FIGS. 2A through 2F are sectional views of a device for explaining a method of manufacturing a transistor in a semiconductor device according to the present invention.

The present invention will be described in detail by way of a preferred embodiment with reference to accompanying drawings, in which like reference numerals are used to identify the same or similar parts.

FIGS. 2A through 2F are sectional views of a device for explaining a method of manufacturing a transistor in a semiconductor device according to the present invention.

Referring now to FIG. 2A, a semiconductor substrate 21 is provided and a part of the semiconductor substrate 21 is etched to form a first trench 22 in which a transistor will be formed.

In the above, the semiconductor substrate 21 is etched by exposure process, X-ray process or E-beam process to thus form the first trench 22 in depth of 300~500 Å locally. The etch depth of the first trench 22 determines the depth where the channel is formed, thus causing the current to flow. In other words, the first trench 22 acts to determine the depth of the channel region.

Figure 2B:
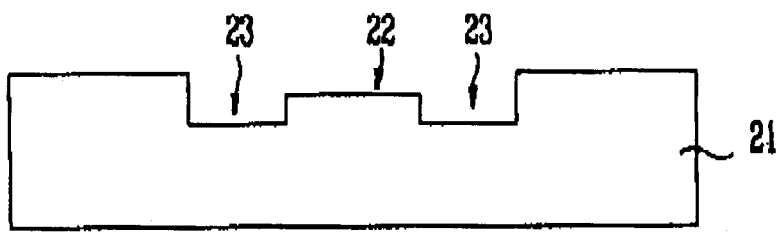

Referring now to FIG. 2B, the semiconductor substrate 21 is etched by exposure process, X-ray process or E-beam process to thus form the second trench 23 within the first trench 22 in depth of 1000~2000 Å. The etch depth of the second trench 23 will determines the depth of the source/drain junction.

Figure 2C:
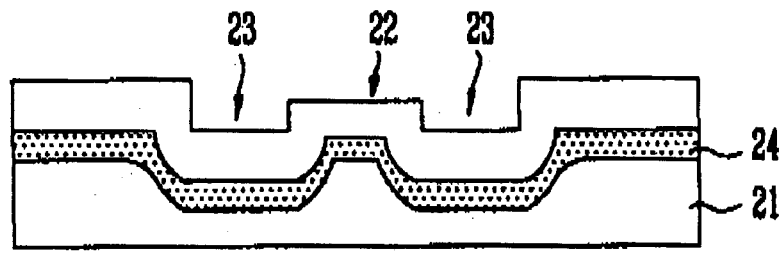

Referring to FIG. 2C, oxygen ions are ion-implant into the portion of the semiconductor substrate 21 including the first and second trenches 22 and 23. Then, a thermal process is performed to form a buried oxide layer 24 at a given location within the semiconductor substrate 21, while stabilizing the semiconductor substrate 21 that is damaged upon ion implantation.

In the above, as the first and second trenches 22 and 23 are formed in different depths from the first surface of the semiconductor substrate 21, the shape of the buried oxide layer 24 is formed to be same to the surface of the semiconductor substrate 21 in which the first and second trenches 22 and 23 are formed. The ion implant process for forming the buried oxide layer 24 is performed by controlling its ion implantation energy so that the depth into which ions will be implanted is at least deeper than the depth in which the channel region will be formed.

Figure 2D:
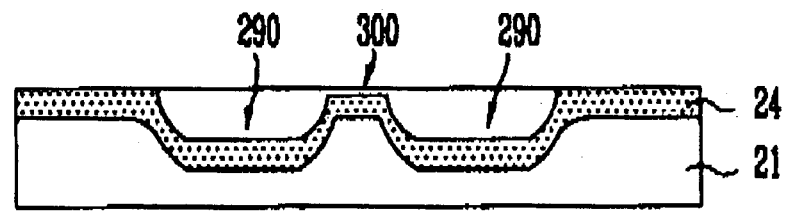

Referring to FIG. 2D, the semiconductor substrate 21 is polished by performing a chemical mechanical polishing (CMP) process. At this time, the polishing is performed using the buried oxide layer 24 formed within the semicon ductor substrate 21 on the portion of which the first and second trenches 22 and 23 are not formed as a polishing stop layer. That is, the polishing process is performed to the point where the buried oxide layer 24 formed within the semiconductor substrate 21 is firstly exposed. By this polishing process, the semiconductor substrate 21 of the portion 290 where a source/drain junction will be formed, and of the portion 300 where a channel region will be formed is isolated by the buried oxide layer 24.

Figure 2E:
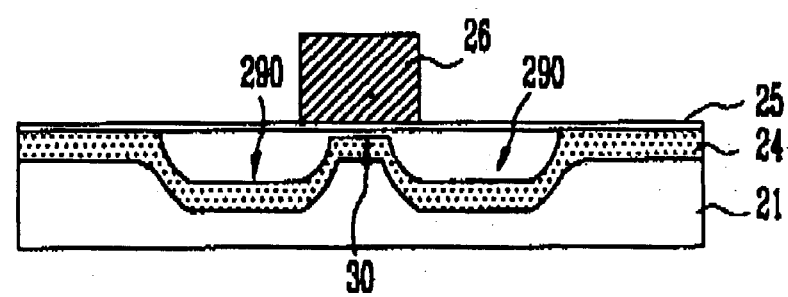

Referring to FIG. 2E, ion implant process for controlling the threshold voltage is performed to form the channel region 30. Oxidization process is performed and the grown oxide film is then removed, thus recover the semiconductor substrate 21 damaged by the chemical mechanical polish process. Then, a gate oxide film 25 is formed on the entire structure. Next, a polysilicon layer, a polysilicon layer/a metal silicide layer or a metal layer, etc. is deposited on the gate oxide film 25 and is then patterned to form a gate electrode 26 on the channel region 30.

Figure 2F:
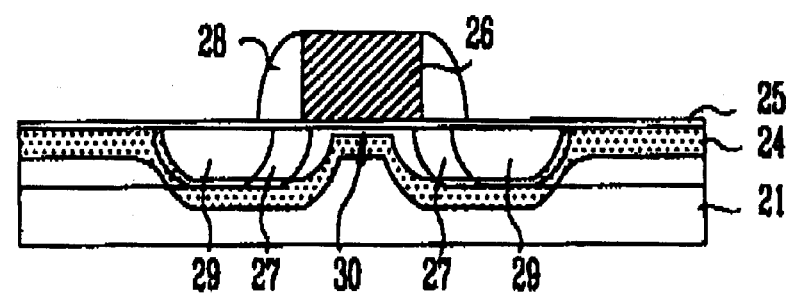

Referring to FIG. 2F, a LDD region 27 is formed by LDD ion implant process and a spacer insulating film 28 is formed on the sidewall of the gate electrode 26. Then, a source/drain junction 29 is formed on the semiconductor substrate 21 by source/drain ion implant process.

In the above, the LDD region 27 is formed by implantation of a low concentration impurity ion up to the buried oxide layer 24 in order to increase the breakdown voltage of the MOS transistor. The source/drain junction 29 is formed by implantation of a high concentration impurity ion up to the buried oxide layer 24.

As can be understood from the above description, the present invention can prevent from generating the punch-through current by isolating the semiconductor substrate by the buried oxide layer with only the source, drain and channel region necessary for driving the transistor being left. Also, it can obviate various parasitic factors such as a leak current, junction conductance, etc. in the p-n junction, which are generated in the interface with the well region in the conventional structure.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a transistor in a semiconductor device, comprising the steps of:

forming a first trench on a surface of a semiconductor substrate;

forming on the surface of said semiconductor substrate second trenches, each trench corresponding to a respective one of a source region and a drain region of a transistor;

implanting ions into said semiconductor substrate including said first and second trenches and then performing a thermal process to form a buried oxide layer in said semiconductor substrate; and polishing at least a portion of said buried oxide layer to isolate the portions of said semiconductor substrate corresponding to the source and drain regions of the transistor from the portion of said semiconductor substrate corresponding to a channel region of the transistor.

2. The method of forming a transistor in a semiconductor device according to claim 1, wherein said step of forming a first trench includes forming a trench having a depth of 300~500 Å using one of an exposure process, X-ray process and E-beam process.

3. The method of forming a transistor in a semiconductor device according to claim 1, wherein said step of forming second trenches includes forming a trench having a depth of 1000~2000 Å using one of an exposure process, X-ray process and E-beam process.

4. The method of forming a transistor in a semiconductor device according to claim 1, wherein said step of implanting ions includes performing by controlling its ion implantation energy so that the ions will be implanted under the channel region of the transistor.

5. The method of forming a transistor in a semiconductor device according to claim 1, wherein said step of polishing includes polishing the surface of the semiconductor substrate to expose said buried oxide layer.

6. The method of forming a transistor in a semiconductor device according to claim 1, wherein said polishing step includes performing an oxidization process and an etch process to repair the surface of said semiconductor substrate damaged during said polishing.

7. The method of forming a transistor in a semiconductor device according to claim 1, further comprising the step of forming a gate electrode wherein said gate electrode includes at least one of a polysilicon layer, a combined polysilicon and metal silicide layer or a metal layer.

* * * * *